(12) United States Patent
Chu et al.

(10) Patent No.: US 7,701,767 B2
(45) Date of Patent: Apr. 20, 2010

(54) STRAP-CONTACT SCHEME FOR COMPACT ARRAY OF MEMORY CELLS

(75) Inventors: Yi-Shin Chu, Taipei (TW); Shih-Wei Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 96 days.

(21) Appl. No.: 12/170,186

(22) Filed: Jul. 9, 2008

(65) Prior Publication Data

US 2010/0008141 A1    Jan. 14, 2010

(51) Int. Cl.
*G11C 16/04* (2006.01)
*H01L 29/788* (2006.01)

(52) U.S. Cl. .................... 365/185.14; 365/185.05; 257/316; 257/319; 257/320

(58) Field of Classification Search ............. 365/185.14
See application file for complete search history.

(56) References Cited

U.S. PATENT DOCUMENTS

| | | | | |
|---|---|---|---|---|
| 5,874,764 A * | 2/1999 | Hsieh et al. | .................. | 257/401 |
| 5,892,707 A * | 4/1999 | Noble | ......................... | 365/149 |
| 6,101,131 A * | 8/2000 | Chang | ................... | 365/185.33 |
| 6,281,544 B1 | 8/2001 | Hong | | |
| 6,417,032 B1 | 7/2002 | Liaw | | |
| 6,569,723 B2 | 5/2003 | Liaw | | |
| 6,734,482 B1 * | 5/2004 | Tran et al. | .................... | 257/296 |
| 7,227,217 B2 * | 6/2007 | Levi et al. | .................... | 257/316 |
| 7,495,958 B2 * | 2/2009 | Chih | ..................... | 365/185.13 |
| 2006/0108632 A1 * | 5/2006 | Roohparvar | ................ | 257/315 |

* cited by examiner

*Primary Examiner*—Son L Mai
(74) *Attorney, Agent, or Firm*—Slater & Matsil, L.L.P.

(57) ABSTRACT

A semiconductor device with multiple strap-contact configurations for a memory cell array. An array with memory cells interconnected with bit-lines, control-gate lines, erase gate lines, common-source lines, and word-lines is provided. In one aspect of an illustrative embodiment, a strap-contact corridor is spaced at n bit-line intervals (n>1) across the array. The strap-contact corridor comprises strap-contact cells, which provide electrical interconnection between control-gate lines, erase gate lines, common-source lines, and word-lines and their respective straps.

16 Claims, 6 Drawing Sheets

STRAP-CONTACT SCHEME FOR COMPACT ARRAY OF MEMORY CELLS

TECHNICAL FIELD

The present invention relates generally to semiconductor devices, and more particularly to strap-contact configurations for a memory cell array.

BACKGROUND

Wide varieties of semiconductor memory devices have been developed. These semiconductor memory devices are continuously employed in new and expanded uses, which require an integrated circuit of increased capabilities and decreased cost. Accordingly, there exists a continuing demand for inexpensive semiconductor devices having increased memory and reduced chip size. Many semiconductor devices are comprised of multiple types of circuits such as memory and logic circuits. Flash memory cells are typically formed, along with other circuits (non-memory circuits) such as core circuits, as embedded flash memory. Flash memory cells may be included in system on a chip (SOC) devices.

Flash memory has become increasingly popular in recent years. A typical flash memory comprises a memory array having a large number of memory cells arranged in blocks. Each of the flash memory cells is fabricated as a field-effect transistor having a control-gate and a floating-gate. The floating-gate is capable of holding charges and is separated from source and drain regions contained in a substrate by a layer of thin oxide. The memory cells may be capable of several operations including program, read, write, and erase. For example, memory cells may be electrically charged by injecting electrons from the drain region through the oxide layer onto the floating-gate. The charges may be removed from the floating-gate, in one known approach, by tunneling the electrons to the source through the oxide layer during an erase operation. The data in a memory cell is thus determined by the presence or absence of a charge on the floating-gate.

Amorphous polysilicon (poly) lines or buried lines (for example patterned doped silicon) may be used to interconnect components of the memory cells together in an array. A contact is provided between the poly or buried line and the interconnect structure (typically metal). As arrays become larger, there may be a voltage drop along poly or buried lines. The voltage drop may be detrimental to the function and speed of the array. One method of overcoming this problem may be to use metal lines rather than poly or buried lines to interconnect components of the memory cells. However, a larger memory cell may then be required to accommodate the space needed to connect contacts to each memory cell component.

SUMMARY OF THE INVENTION

These and other problems are generally solved or circumvented, and technical advantages are generally achieved by a strap-contact configuration for a memory cell array.

A semiconductor device is presented including a plurality of memory cells arranged in an array. The array includes a plurality of bit-lines, each bit-line forming a column in the array, a plurality of control-gate lines, each control-gate line forming a control-gate sub-row in the array, a plurality of erase gate lines, each erase gate line forming an erase gate sub-row in the array, a plurality of common-source lines, each common-source line forming a common-source sub-row in the array, and a plurality of word-lines, each word-line forming a row in the array.

Further, the array includes a plurality of straps, each strap electrically coupled to one or more of a control-gate line, an erase gate line, a common-source line and a word-line. Moreover, each strap is electrically coupled through a strap-contact in a strap-contact cell to the one or more of the control-gate line, the erase gate line, the common-source line, or the word-line.

A first memory cell is electrically connected to a first bit-line, a first control-gate line, a shared erase gate line, a shared common-source line, and a first word-line. A second memory cell is electrically connected to a first bit-line, a second control-gate line, the shared erase gate line, the shared common-source line, and a second word-line. The first memory cell and the second memory cell form a unit set. A plurality of strap-contact cells is provided, wherein a strap-contact cell is substantially a same length as the unit set and from about one to three times a width of the unit set.

An advantage of an illustrative embodiment is providing a strap-shunting configuration with efficient masking steps without adding complicated process steps.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

A semiconductor device of the presently preferred embodiments is discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely, a split gate flash memory array. The invention may also be applied, however, to other flash memory arrays and to other semiconductor devices comprising arrays.

Figure 1:
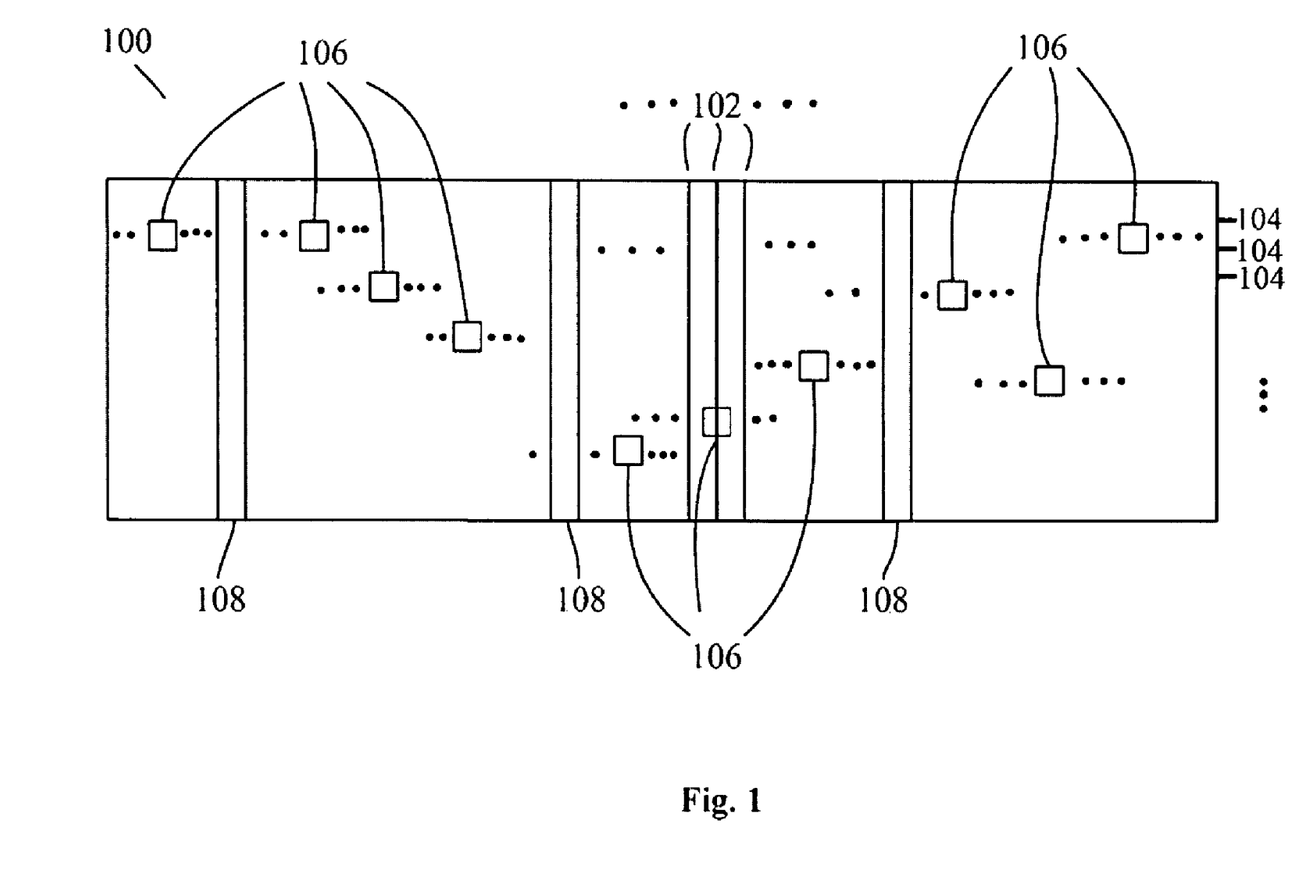
FIG. 1 is a plan view of a portion of a memory array in accordance with an illustrative embodiment.

Turning now to FIG. 1, a plan view of a portion of a memory array in accordance with an illustrative embodiment is shown. Array 100 comprises memory cells arranged in rows and columns. A few of the plurality of memory cells 106 making up the array are depicted by intersections of bit-line (BL) columns 102, and word-line (WL) rows 104. Bit-lines are conducting lines, which may be comprised of metal, layers of metal, polysilicon or the like. In one aspect of an embodiment, bit-lines are comprised of the first layer of metal interconnect, metal 1, which may be Al, Cu, other metals and alloys, polysilicon and other conductive materials. In this example, the bit-lines are a Cu damascene structure. Word-lines are typically polysilicon lines but may be comprised of other conductive materials.

In an illustrative embodiment, strap-contact corridors 108 are provided parallel to BL columns 102. Strap-contact corridors 108 are columns within array 100 that provide strap-contacts for straps. Straps (not shown) are conductive lines that serve as shunts for poly lines or buried layer lines. A metal line, for example, may have a much lower voltage drop along the length of the line than does a poly or buried line. Therefore, an advantage to shunting poly lines with metal or other conductive lines may be that a more consistent voltage is provided to each memory cell. However, the addition of straps may add significantly to the area of the array, because strap-contacts may require array area. Therefore, in an illustrative embodiment, strap-contacts to each memory cell are not provided. Rather, a poly or buried line may be provided with a strap-contact periodically across the array. Thus, an illustrative embodiment may have the advantages of the consistent voltages of a metal line, while each memory cell need not be expanded to accommodate the extra space needed for each memory cell node strap-contact. Further, a different number of strap-contacts may be provided for different memory cell lines, allowing for flexibility when designing a memory array in accordance with an illustrative embodiment. For example, a control-gate line may be provided a strap-contact every 128 bits, whereas a common-source line may be provided a strap-contact every 32 bits.

Strap-contact corridor 108 may comprise control-gate (CG) contacts, which contact CG lines, common-source (CS) contacts, which contact CS lines, erase gate (EG) contacts, which contact EG lines, and word-line (WL) contacts, which contact WLs. Strap-contacts are comprised of conductive materials such as W, polysilicon, metals, metal alloys, other conductive materials, or the like. A preferred contact material may be tungsten, for example. Typically, strap-contacts are formed by patterning and etching material in layers between the conductive lines to be interconnected, thus a contact hole is provided for a conducting contact material. The landing for a strap-contact on poly or silicon is typically sized large enough to allow for some process variation. The landing size for a contact may vary depending on such factors as the number and types of materials in the intervening layers that must be etched. Strap-contact landings may significantly increase the size of the array. However, if too few contacts are provided to the straps, the poly and buried lines may be too resistive and the array may not be optimized. Throughout the description, the term "unit set" is used to refer to two memory cells sharing a common-source.

Figure 2:
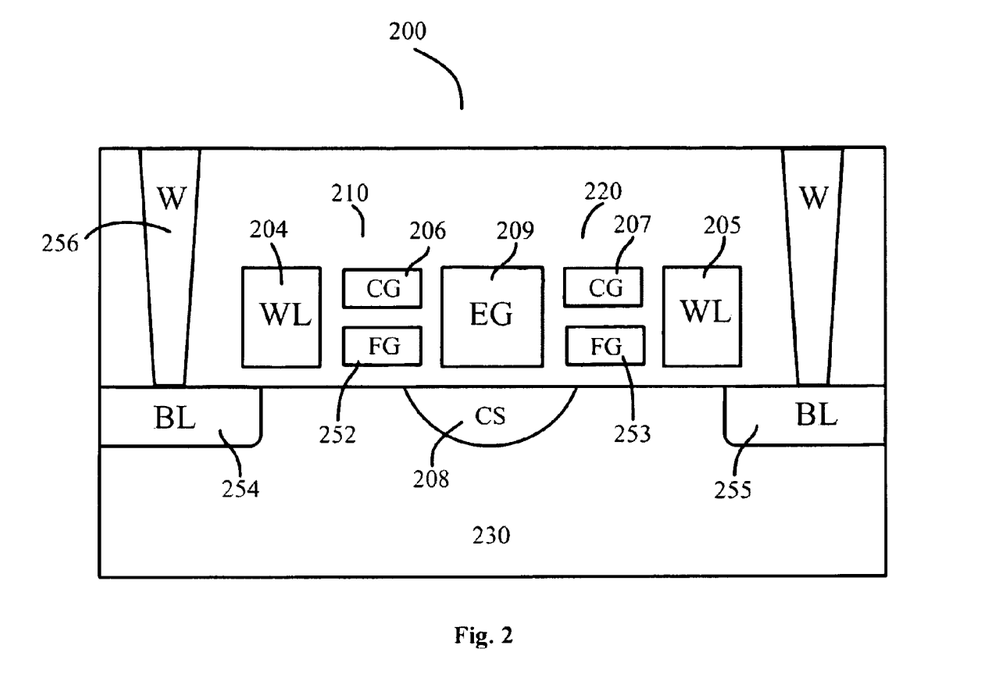
FIG. 2 is a cross-sectional view of a unit set.

FIG. 2 illustrates a cross-sectional view of a unit set, in accordance with an embodiment. Unit set 200 includes two common-source flash memory cells 210 and 220 formed on a semiconductor substrate 230. Memory cell 210 includes floating-gate $FG_1$ 252, control-gate $CG_1$ 206, word-line $WL_1$ 204, and bit-line node $BL_1$ 254. $BL_1$ 254 may be shared with another unit set (not shown). $BL_1$ contact 256 connects $BL_1$ 254 to a bit-line (not shown). Memory cell 220 includes floating-gate $FG_2$ 253, control-gate $CG_2$ 207, word-line $WL_2$ 205, and bit-line node $BL_2$ 255. Again, $BL_2$ 255 may be shared with another unit set (not shown). Memory cells 210 and 220 share common-source CS 208 and erase-gate EG 209. Bit-line nodes $BL_1$ 254 and $BL_2$ 255 are interconnected by a bit-line (not shown).

It may be noted that erase gate EG 209 is over common-source CS 208. Therefore, according to an illustrative embodiment, a strap-contact to an erase gate and a common-source may not occur in the same strap-contact unit set.

In an illustrative embodiment, control-gates $CG_1$ 206 and $CG_2$ 207 are disconnected from each other, and thus may be connected to different voltages. As an example, during a program operation of memory cell 210, a voltage may be applied between bit-line node $BL_1$ 254 and common-source CS 208, with, for example, a bit-line voltage of about 0.4V and a common-source voltage of about 4V, for example. Word-line $WL_1$ 204 may have a voltage applied, of about 1.5V, for example, in order to turn on a channel in semiconductor substrate 230. Therefore, a current flows between common-source CS 208 and bit-line node $BL_1$ 254. A high control-gate voltage, about 10V, for example, may be applied on control-gate $CG_1$ 206, and thus electrons are programmed into floating-gate $FG_1$ 252 under the influence of a high electrical field. At the time memory cell 220 may be programmed, control-gate $CG_2$ 207 of memory cell 220 may be connected to a low voltage, for example, about 0V.

Mono strap-contact cells are those strap-contact cells which employ one type of strap-contact, such as CG (that is both $CG_1$ and $CG_2$), CS, WL (that is both $WL_1$ and $WL_2$), and EG. Different mono strap-contact cells may be different sizes depending on what type of mono strap-contact it employs.

Figure 3:
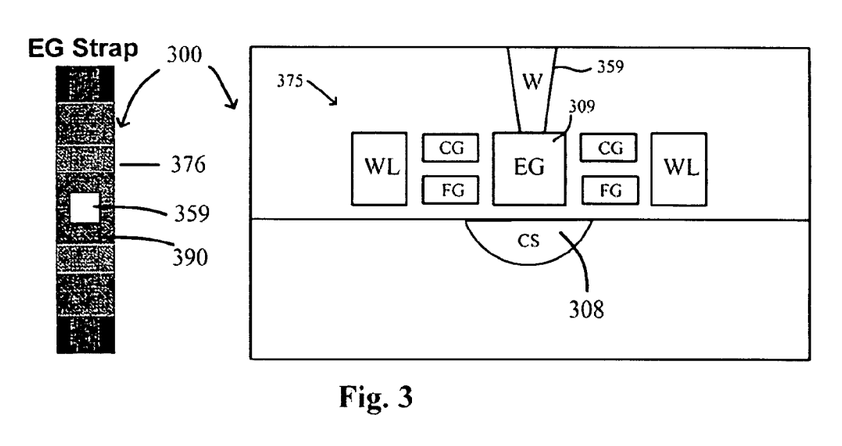
FIG. 3 shows a cross-sectional view of an EG strap-contact cell, with a corresponding top view.

FIG. 3 shows a cross-sectional view 375 of an EG strap-contact cell 300, with a corresponding top view 376. EG strap-contact cell 300 is a mono strap-contact, meaning that only one type of strap-contact is included in the cell. Thus, a mono strap-contact cell may include a CS strap-contact, an EG strap-contact, both the $CG_1$ and $CG_2$ strap-contacts, or both the $WL_1$ and $WL_2$ strap-contacts. Cross-sectional view 375 shows EG strap-contact cell 300 employing EG strap-contact 359 to contact EG 309. Corresponding top view 376 shows a polysilicon EG strap layer 390 under EG contact 359. Recall from FIG. 2 that the EG poly 209 is over CS region 208.

Figure 4:
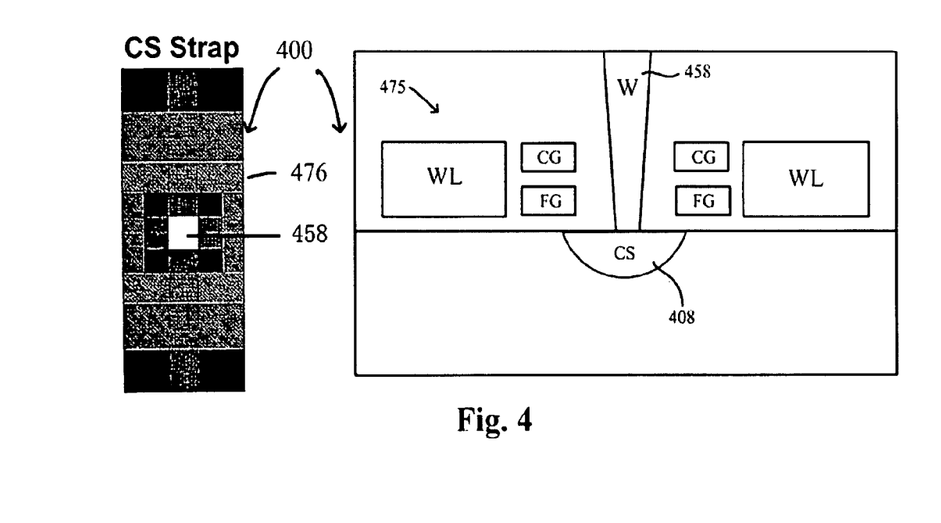
FIG. 4 shows a cross-sectional view of a CS strap-contact cell, with a corresponding top view.

FIG. 4 shows a cross-sectional view 475 of a CS strap-contact cell 400, with a corresponding top view 476. CS strap-contact cell 400 employs CS strap-contact 458 to contact CS 408. Note that the EG 209 is removed from unit set 400 (compare with unit set 200 in FIG. 2), thereby enabling CS strap-contact 458 to contact CS 408 in the substrate. Thus, in one aspect of an illustrative embodiment, there may be no multi strap-contact cells that include both EG strap-contacts and CS strap-contacts. Top view 476 of CS strap-contact cell 400 shows that there is no polysilicon EG layer under the CS strap-contact 458 (compare with top view 376 of FIG. 3 showing polysilicon EG layer 390).

Figure 5A:
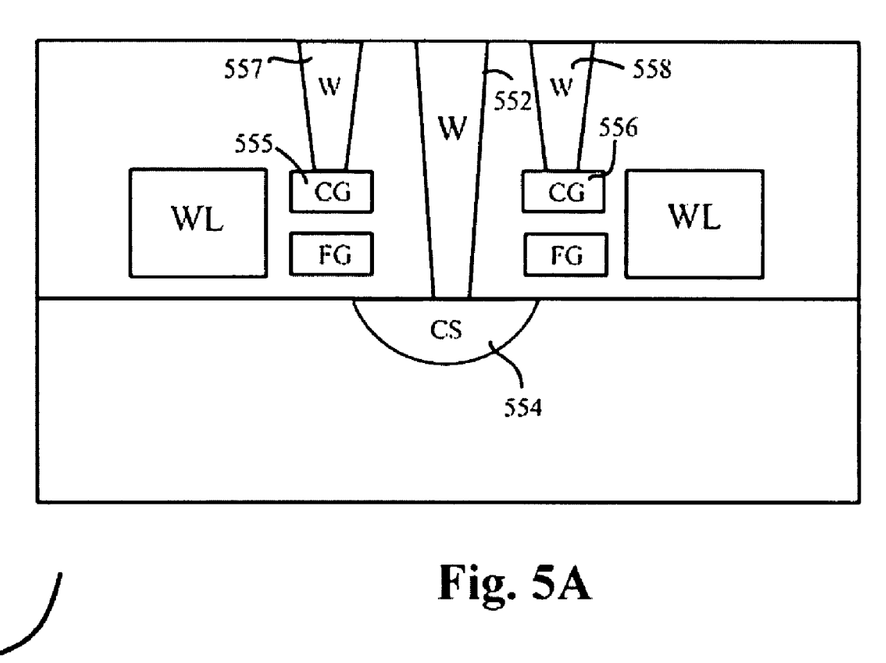
FIG. 5A depicts a first embodiment of a CS/CG multi strap-contact cell, with a corresponding top view depicted in FIG. 5B.
Figure 5B:
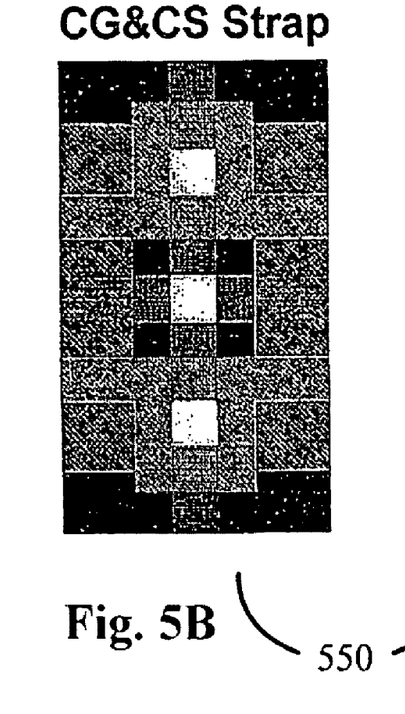
Figure 6:
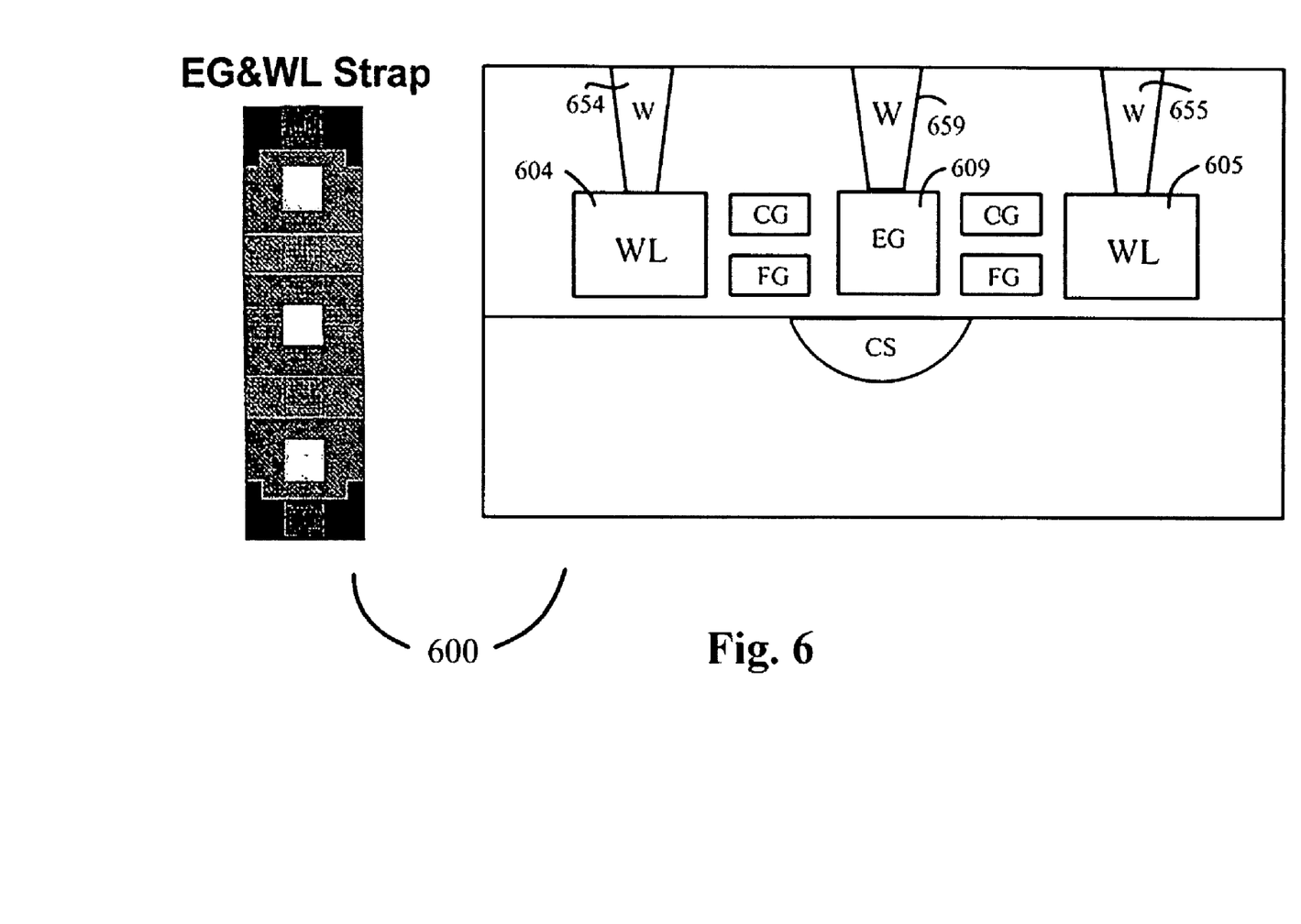
FIG. 6 shows an EG/WL multi strap-contact cell, with a corresponding top view.

In an embodiment, a multi strap-contact cell may employ more than one type of strap-contact, within a unit set, such as unit set 200 in FIG. 2. Such multi strap-contact cells may be, for example, EG/WL, CG/CS, WL/CS, or CG/EG strap-contact cells. For optimum signal transmission and to minimize the area of a memory array, a variety of mono and multi strap-contact cells may be employed in the memory array. FIG. 5, which includes FIGS. 5A-5B shows an example of a CG/CS strap-contact cell. FIG. 6 shows an example of an EG/WL multi-strap contact cell.

FIG. 5A depicts an embodiment of a CS/CG multi strap-contact cell, with a corresponding top view in FIG. 5B. A CG/CS multi strap-contact cell 550 is shown. CS strap-contact 552 contacts CS 554. $CG_1$ 557 and $CG_2$ 558 strap-contact contact $CG_1$ 555 and $CG_2$ 556. In another embodiment, $CG_1$ 557 and $CG_2$ 558 strap-contacts may have an expanded landing configuration, allowing for process variations in the contact process. The strap-contact unit set may be modified to accommodate a larger CG contact landing, as compared to a CG line in a unit set.

Figure 5C:
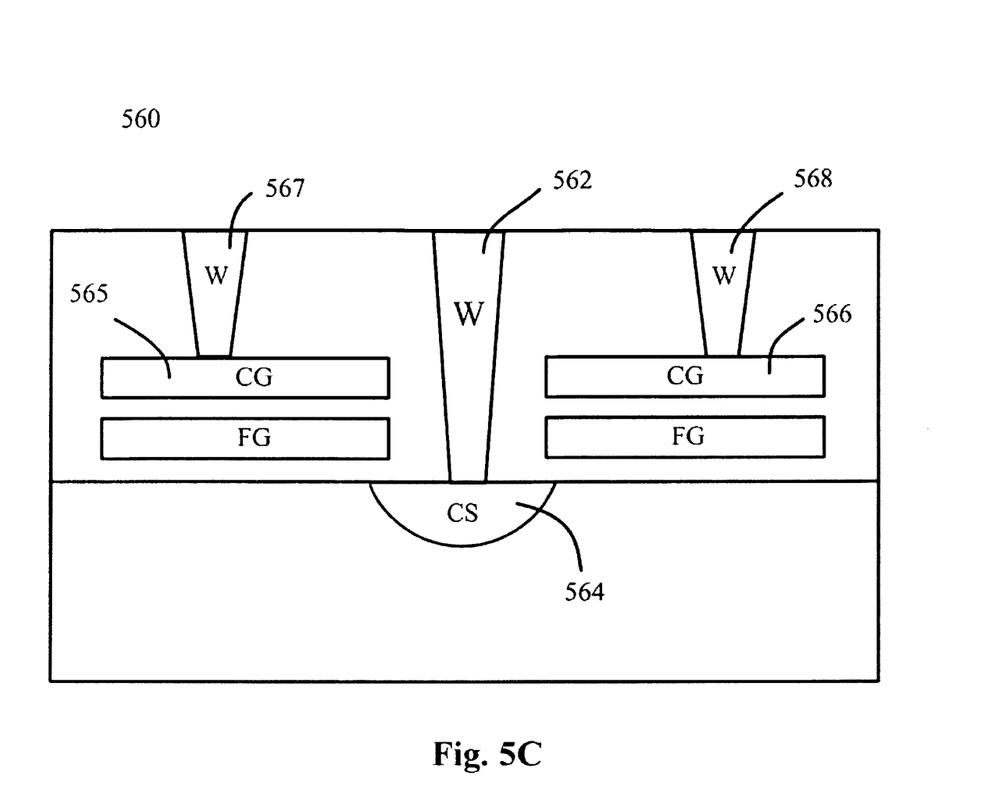
FIG. 5C depicts a second embodiment of a CS/CG multi strap-contact cell.

FIG. 5C illustrates another embodiment of a CS/CG multi strap-contact cell. The WL poly may be discontinued in a CG strap-contact unit set and the CG strap-contact landing may be placed in the WL location in the CG strap-contact unit set. CG/CS multi strap-contact cell 560 is shown. CS strap-contact 562 contacts CS 564. $CG_1$ 567 and $CG_2$ 568 strap-contacts contact $CG_1$ 565 and $CG_2$ 566, respectively. $CG_1$ 567 and $CG_2$ 568 strap-contacts may have an expanded landing configuration, allowing for process variations in the contact process.

In another embodiment, the CG poly may be expanded to over the WL poly (with an isolation layer in between the two layers). In either example case, the WL poly may not have a strap-contact within the same unit set. While $CG_1$ 565 and $CG_2$ 566 are in the multi strap-contact cell with CS strap-contact 562, the metal connections (not shown) to these contacts are not shorted together. The contacts are coupled to different metal layers formed in the subsequent processing of the semiconductor device (not shown).

FIG. 6 shows an EG/WL multi strap-contact cell. EG/WL multi strap-contact cell 600 includes $WL_1$ strap-contact 654 coupled to $WL_1$ 604, $WL_2$ strap contact 655 coupled to $WL_2$ 605, and EG contact 659 coupled to EG 609.

The scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a plurality of memory cells arranged in an array;
   a plurality of bit-lines, each bit-line forming a column in the array;
   a plurality of control-gate lines, each control-gate line forming a control-gate sub-row in the array;
   a plurality of erase gate lines, each erase gate line forming an erase gate sub-row in the array;
   a plurality of common-source lines, each common-source line forming a common-source sub-row in the array;
   a plurality of word-lines, each word-line forming a word-line row in the array;
   a plurality of straps, each strap electrically coupled to at least one of the control-gate line, the erase gate line, the common-source line and the word-line, wherein each strap is electrically coupled through a strap-contact in a strap-contact cell to each of the control-gate line, the erase gate line, the common-source line, and the word-line;
   a first memory cell electrically connected to a first bit-line, a first control-gate line, a shared erase gate line, a shared common-source line, and a first word-line;
   a second memory cell electrically connected to the first bit-line, a second control-gate line, the shared erase gate line, the shared common-source line and a second word-line, wherein the first memory cell and the second memory cell form a unit set;
   a plurality of strap-contact cells, wherein each strap-contact cell has substantially a same length as the unit set and has a width from about one to three times a width of the unit set; and
   a plurality of strap-contact corridors, each strap-contact corridor forming a sub-column in the array, wherein each strap-contact corridor comprises at least one strap-contact cell, and wherein a width of each strap-contact corridor is substantially the width of each strap-contact cell.

2. The semiconductor device of claim 1, wherein each strap-contact corridor is a control-gate strap-contact corridor, and wherein the control-gate strap-contact corridor is about three times the width of the unit set.

3. The semiconductor device of claim 1, wherein each strap-contact corridor is an erase gate strap-contact corridor, and wherein the erase gate strap-contact corridor is substantially the same width as the unit set.

4. The semiconductor device of claim 1, wherein each strap-contact corridor is a common-source strap-contact corridor, and wherein the common-source strap-contact corridor is about two times the width of the unit set.

5. The semiconductor device of claim 1, wherein each strap-contact corridor is a word-line strap-contact corridor, and wherein the word-line strap-contact corridor is about 1.5 times the width of the unit set.

6. The semiconductor device of claim 1, wherein each strap-contact corridor is a control-gate/common-source multi strap-contact corridor, and wherein the control-gate/common-source multi strap-contact corridor is about three times the width of the unit set.

7. The semiconductor device of claim 1, wherein each strap-contact corridor is a control-gate/erase gate multi strap-contact corridor, and wherein the control-gate/erase gate multi strap-contact corridor is about three times the width of the unit set.

8. The semiconductor device of claim 1, wherein each strap-contact corridor is a word-line/common-source multi strap-contact corridor, and wherein the word-line/common-source multi strap-contact corridor is about two times the width of the unit set.

9. The semiconductor device of claim 1, wherein each strap-contact corridor is a word-line/erase gate multi strap-contact corridor, and wherein the word-line/erase gate multi strap-contact corridor is about 1.5 times the width of the unit set.

10. The semiconductor device of claim 1, wherein the plurality of strap-contact corridors is separated by n bit-lines, wherein n is greater than or equal to one.

11. The semiconductor device of claim 1 further comprising:
- a plurality of control-gate strap-contacts with j bit-lines between each of the plurality of control-gate strap-contacts in the control-gate sub-row;
- a plurality of erase gate strap-contacts with k bit-lines between each of the plurality of erase gate strap-contacts in the erase gate sub-row;
- a plurality of common-source strap-contacts with m bit-lines between each of the plurality of common-source strap-contacts in the common-source sub-row; and
- a plurality of word-line strap-contacts with p bit-lines between each of the plurality of word-line strap-contacts in the word-line row.

12. The semiconductor device of claim 11, wherein j, k, m, and p may be any integer greater than or equal to one.

13. The semiconductor device of claim 11, wherein $j \neq k$, $j \neq m$, and $j \neq p$.

14. The semiconductor device of claim 11, wherein $k = m$.

15. The semiconductor device of claim 14, wherein $k \neq p$.

16. The semiconductor device of claim 1 further comprising:
- one control-gate strap-contact for b bit-lines in the control-gate sub-row, wherein b is equal to a number of bit lines in the array.

* * * * *